US012588415B2

(12) United States Patent
Gao et al.

(10) Patent No.: US 12,588,415 B2
(45) Date of Patent: Mar. 24, 2026

(54) METHODS FOR REDUCING SURFACE DEFECTS IN ACTIVE FILM LAYERS

(71) Applicant: Applied Materials, Inc., Santa Clara, CA (US)

(72) Inventors: Ming Gao, Xi'an Shaanxi (CN); Lizhong Sun, San Jose, CA (US); Xiaodong Yang, Xi'an (CN)

(73) Assignee: Applied Materials Inc., Santa Clara, CA (US)

( * ) Notice: Subject to any disclaimer, the term of this patent is extended or adjusted under 35 U.S.C. 154(b) by 221 days.

(21) Appl. No.: 17/886,854

(22) Filed: Aug. 12, 2022

(65) Prior Publication Data

US 2023/0345836 A1 Oct. 26, 2023

(30) Foreign Application Priority Data

Apr. 21, 2022 (WO) ................ PCT/CN2022/088119

(51) Int. Cl.
*H10N 30/079* (2023.01)
*H10N 30/00* (2023.01)
*H10N 30/076* (2023.01)
*H10N 30/50* (2023.01)

(52) U.S. Cl.
CPC ......... *H10N 30/079* (2023.02); *H10N 30/076* (2023.02); *H10N 30/50* (2023.02); *H10N 30/708* (2024.05)

(58) Field of Classification Search
CPC ...................................... H10N 30/50
See application file for complete search history.

(56) References Cited

U.S. PATENT DOCUMENTS

2005/0185026 A1 8/2005 Noguchi et al.
2015/0244347 A1* 8/2015 Feng ...................... H03H 9/175
333/187

(Continued)

FOREIGN PATENT DOCUMENTS

| CN | 109905098 A | 6/2019 |
| CN | 111969974 A | 11/2020 |
| WO | WO 2022/040869 A1 | 3/2022 |

OTHER PUBLICATIONS

Kamohara et al. "Growth of highly c-axis-oriented aluminum nitride thin films on molybdenum electrodes using aluminum nitride interlayers" (Jan. 2005).*

(Continued)

*Primary Examiner* — Austin Murata
(74) *Attorney, Agent, or Firm* — Moser Taboada

(57) ABSTRACT

A method of reducing surface defects of a piezoelectric film layer includes depositing a first seed layer on a substrate, depositing an intermediate film layer on the first seed layer at a first temperature of approximately 350 degrees Celsius to approximately 700 degrees Celsius, depositing a second seed layer on the intermediate film layer, and depositing a piezoelectric film layer at a second temperature of less than 200 degrees Celsius. The piezoelectric film layer has a surface cone defect count of less than or equal to 2 per 100 microns$^2$ of surface area of the piezoelectric film layer. In some embodiments, no vacuum breaks occur between depositions of the first seed layer, the intermediate film layer, the second seed layer, and the piezoelectric film layer.

20 Claims, 3 Drawing Sheets

(56)  References Cited

U.S. PATENT DOCUMENTS

| | | | |
|---|---|---|---|
| 2015/0333249 A1* | 11/2015 | Moulard | H03H 9/02015 |
| | | | 29/25.35 |
| 2021/0259103 A1 | 8/2021 | Li et al. | |
| 2021/0262082 A1* | 8/2021 | Lin | H01L 21/67109 |
| 2021/0405399 A1 | 12/2021 | Teo et al. | |
| 2023/0009085 A1 | 1/2023 | Sun et al. | |
| 2023/0142065 A1* | 5/2023 | Kuroda | H10N 30/20 |
| | | | 310/316.01 |

OTHER PUBLICATIONS

Hagiwara et al., Study on Cone-defects during the Pattern Fabrication Process with Silicon Nitride, Journal of Photopolymer Science and Technology, vol. 28 No. 1, May 2015, 8 pages.
Zhang et al., Deposition, Characterization, and Modeling of Scandium-Doped Aluminum Nitride Thin Film for Piezoelectric Devices, MDPI, 2021, 11 pages.
PCT International Search Report and Written Opinion for PCT/CN2022/088119 dated Dec. 19, 2022.

* cited by examiner

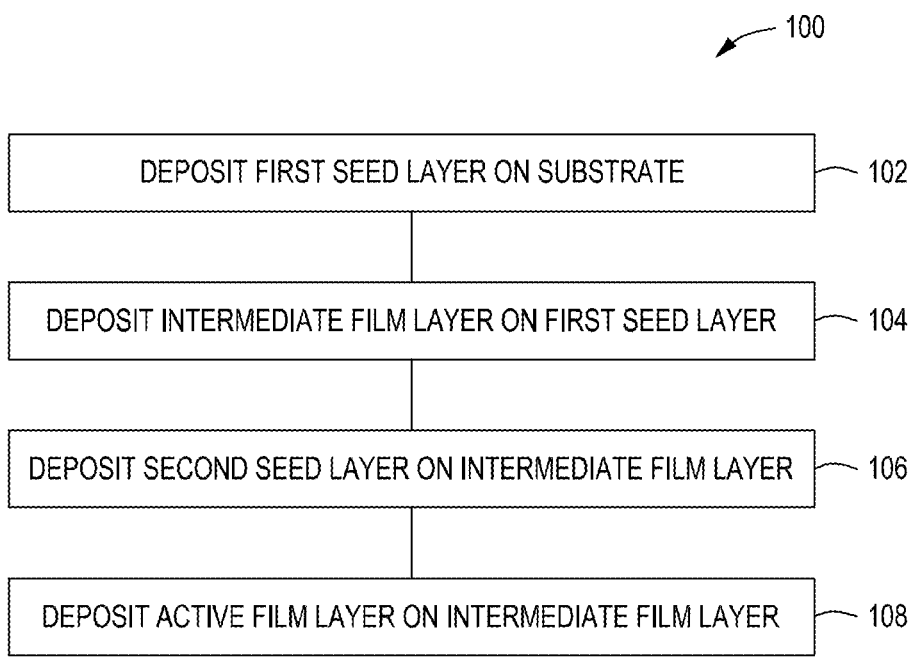
FIG. 1
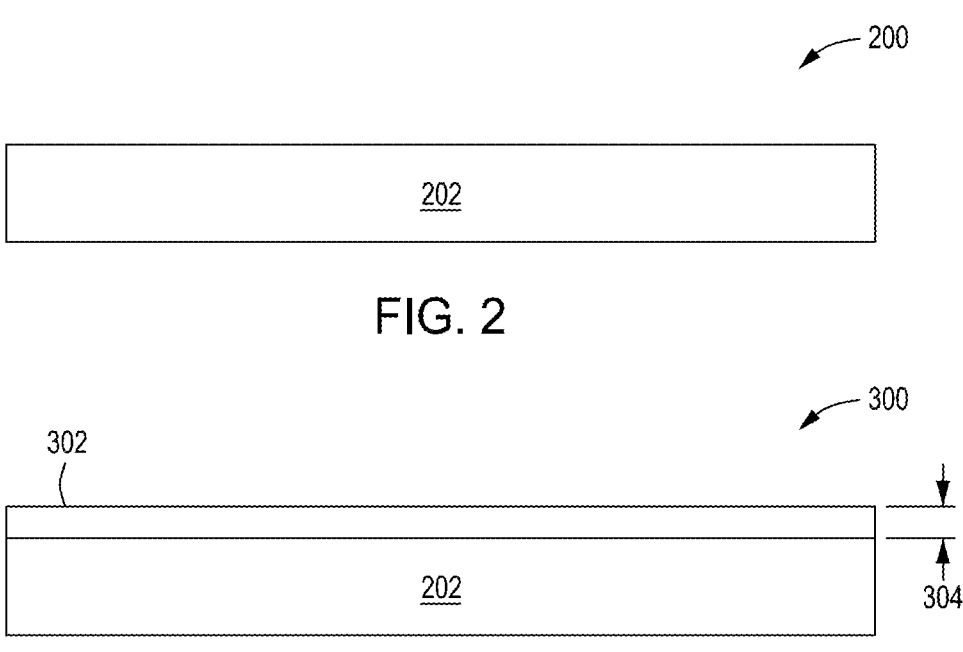
FIG. 2
FIG. 3

METHODS FOR REDUCING SURFACE DEFECTS IN ACTIVE FILM LAYERS

CROSS-REFERENCE TO RELATED APPLICATIONS

This application claims the benefit of Patent Cooperation Treaty Application PCT/CN2022/088119, filed on Apr. 21, 2022, which is herein incorporated by reference in its entirety.

FIELD

Embodiments of the present principles generally relate to semiconductor processing of semiconductor substrates.

BACKGROUND

Piezoelectric devices and micro-electromechanical systems (MEMS) may incorporate scandium doped aluminum nitride (ScAlN) thin film layers (active film layers) during formation of the devices and systems. One of the limiting factors of using scandium doped aluminum nitride is the ability to produce a film layer without defects on the surface of the scandium doped aluminum nitride. The defects reduce the performance of the devices and systems. However, the inventors have observed that traditional processes used to form scandium doped aluminum nitride film layers cause high numbers of surface cone defects, substantially reducing the performance of devices/systems.

Accordingly, the inventors have provided methods for reducing surface defects of deposited active film layers, dramatically improving performance of structures using the film layer.

SUMMARY

Methods for reducing surface defects of deposited active film layers are provided herein.

In some embodiments, a method of reducing surface defects of a film layer may comprise depositing a first seed layer on a substrate, depositing an intermediate film layer on the first seed layer at a first temperature of approximately 350 degrees Celsius to approximately 700 degrees Celsius, depositing a second seed layer on the intermediate film layer, and depositing a piezoelectric film layer at a second temperature of less than 200 degrees Celsius.

In some embodiments, the method may further include wherein the first seed layer, the intermediate film layer, and the second seed layer are deposited without vacuum breaks between depositions; wherein the intermediate film layer is a molybdenum layer and the piezoelectric film layer is a scandium doped aluminum nitride layer; wherein the scandium doped aluminum nitride layer has a surface cone defect count of less than or equal to 2 per 100 microns$^2$ of surface area of the scandium doped aluminum nitride layer due, at least in part, to increased crystallinity of the intermediate film layer and to reduced formation of surface cone defects on the piezoelectric film layer due to the second seed layer; wherein the first seed layer is aluminum nitride and the second seed layer is aluminum nitride; wherein the scandium doped aluminum nitride layer is approximately 20% scandium; wherein the first seed layer is approximately 10 nm to approximately 200 nm in thickness; wherein the second seed layer is approximately 5 nm to approximately 55 nm in thickness; wherein the first seed layer has a thickness of approximately 150 nm, the molybdenum layer has a thickness of approximately from 20 nm to 400 nm, and the second seed layer has a thickness of approximately 35 nm, wherein the scandium doped aluminum nitride layer is approximately 30% scandium; wherein the first seed layer is approximately 10 nm to approximately 50 nm in thickness; wherein the second seed layer is approximately 5 nm to approximately 40 nm in thickness; and/or wherein the first seed layer has a thickness of approximately 30 nm, the molybdenum layer has a thickness of approximately 25 nm, and the second seed layer has a thickness of approximately 10 nm.

In some embodiments, a method of reducing surface defects of a film layer may comprise degassing a substrate, depositing a first seed layer of aluminum nitride on the substrate in a first deposition chamber after degassing, moving the substrate from the first deposition chamber to a second deposition chamber without a vacuum break, depositing a molybdenum layer on the first seed layer in the second deposition chamber at a first temperature of 350 degrees Celsius to approximately 700 degrees Celsius, moving the substrate from the second deposition chamber to the first deposition chamber without a vacuum break, depositing a second seed layer of aluminum nitride on the molybdenum layer after depositing the molybdenum layer, cooling the substrate and exposing the substrate to ambient environment, degassing the substrate, and depositing a scandium doped aluminum nitride layer at a second temperature of less than 200 degrees Celsius in a third deposition chamber, wherein the scandium doped aluminum nitride layer has a surface cone defect count of less than or equal to 2 per 100 microns$^2$ of surface area of the scandium doped aluminum nitride layer.

In some embodiments, the method may further include wherein the scandium doped aluminum nitride layer is approximately 20% scandium; wherein the first seed layer is approximately 10 nm to approximately 200 nm in thickness and wherein the second seed layer is approximately 5 nm to approximately 55 nm in thickness; wherein the scandium doped aluminum nitride layer is approximately 30% scandium; and/or wherein the first seed layer is approximately 10 nm to approximately 50 nm in thickness and wherein the second seed layer is approximately 5 nm to approximately 40 nm in thickness.

In some embodiments, a non-transitory, computer readable medium having instructions stored thereon that, when executed, cause a method of reducing surface defects of a film layer to be performed, the method may comprise depositing a first seed layer on a substrate, depositing a molybdenum layer on the first seed layer at a first temperature of approximately 350 degrees Celsius to approximately 700 degrees Celsius, depositing a second seed layer on the molybdenum layer, and depositing a scandium doped aluminum nitride layer at a second temperature of less than 200 degrees Celsius, wherein the scandium doped aluminum nitride layer has a surface cone defect count of less than or equal to 2 per 100 microns$^2$ of surface area of the scandium doped aluminum nitride layer.

In some embodiments, the method of the non-transitory computer readable medium may further include wherein the scandium doped aluminum nitride layer is 20% or 30% scandium, wherein the first seed layer has a thickness of approximately 10 nm to approximately 200 nm for 20% scandium, wherein first seed layer has a thickness of approximately 10 nm to approximately 50 nm for 30% scandium, wherein the molybdenum layer has a thickness of approximately 20 nm to approximately 250 nm for 20% scandium or 30% scandium, wherein the second seed layer has a thickness of approximately 5 nm to approximately 55 nm for 20% scandium, and wherein the second seed layer has a thickness of approximately 5 nm to approximately 40 nm for 30% scandium.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

FIG. 1 is a method of forming a film stack in accordance with some embodiments of the present principles.

FIG. 2 depicts a cross-sectional view of a substrate in accordance with some embodiments of the present principles.

FIG. 3 depicts a cross-sectional view of forming a first seed layer in accordance with some embodiments of the present principles.

Figure 4:
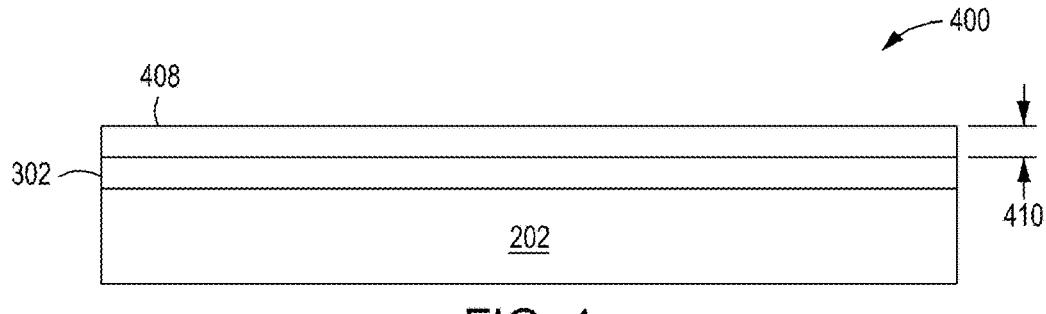
FIG. 4 depicts a cross-sectional view of forming an intermediate film layer on a first seed layer in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

In some embodiments, the methods provide a high-quality active film layer (e.g., a scandium doped aluminum nitride thin film layer) with minimal surface cone defects. For example, the techniques can provide a new process flow to improve the quality of a scandium doped aluminum nitride active film layer grown on a molybdenum intermediate layer. The resulting scandium doped aluminum nitride active film layer possesses good crystal orientation which yields smaller full-width-half-maximums (FWHMs) and loss tangents during fabrication of, for example, piezo-electric materials and others. The methods advantageously provide both good active film surface quality and good crystal orientation of intermediate film layers during plasma vapor deposition (PVD) sputtering of scandium doped aluminum nitride film stacks.

Films with a scandium doped aluminum nitride content of x=20% to 30% (Sc$_x$Al$_{(1-x)}$N) and above is of high interest for MEMS sensing and actuation, ultrasound generation, and energy harvesting applications. The higher the concentration of scandium doping, the stronger the electrical field of the device/system. Depositing scandium doped aluminum nitride films from a highly doped aluminum target to meet industry requirements on the film properties is difficult. Some devices/systems have even stricter requirements than for integrated circuit applications such as good crystallinity (FWHM: <1.5°) and good surface morphology. The methods of the present principles enable the ability for the scandium doped aluminum nitride film layer to meet all the requirements and more. The methods allow higher control of molybdenum and seed layer performances to improve scandium doped aluminum nitride film stack surface cone defects and FWHM.

Figure 7:
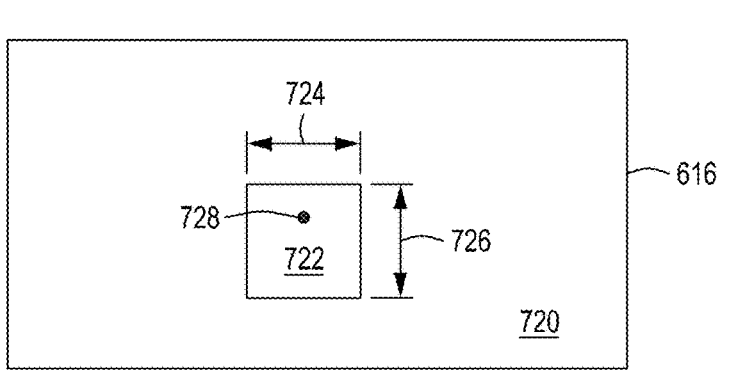
FIG. 7 depicts a top-down view of a surface showing cone defects per area on an active film layer in accordance with some embodiments of the present principles.

In brief, a process for providing increased control of film orientation and reduced surface cone defects may include depositing a first seed layer, an intermediate film layer (e.g., a molybdenum layer), a second seed layer, and then an active film layer (e.g., a piezoelectric film layer such as a scandium doped aluminum nitride layer). The second seed layer and careful control of the film stack process through elimination of vacuum breaks and specific thickness combinations of the different film layers, may yield, for example, scandium doped aluminum nitride active film surfaces with 1 or 2 surface cone defects or less per 100 microns$^2$ for 20% or 30% scandium doped aluminum nitride layer compositions. For reference, FIG. 7 depicts a top-down view 700 of an active film surface 720 showing one surface cone defect 728 per area 722 on an active film layer such as scandium doped aluminum nitride layer 616 in accordance with some embodiments. As used herein, the area 722 is defined as a 100 micron$^2$ area (e.g., width 724=10 microns, length 726=10 microns, etc.).

The techniques provided herein provide similar benefits to any plasma vapor deposition (PVD) deposited films to improve the crystallinity through high temperature deposition of an intermediate film layer on a first seed layer and high surface quality of an active film layer by using a second seed layer on the intermediate film layer before deposition of the active film layer. The intermediate film layer, in some film stacks, may function as an electrode and may include, but not limited to, films formed from tungsten, ruthenium, and molybdenum, and the like. The active layer, in some film stacks, may include piezoelectric active film layers using film materials such as, but not limited to, lead zirconate (PZT), lithium niobate (LiNbO$_3$), lithium tantalate (LiTaO$_3$), and scandium doped aluminum nitride (ScAlN), and the like. The first and second seed layer material may be adjusted based on compatibility with the intermediate layer material and the active layer material.

For the sake of brevity, and not meant to be limiting, the examples herein are based on a molybdenum intermediate film layer and a scandium doped aluminum nitride active film layer with a first and second seed layers of aluminum nitride. FIG. 1 is a method 100 of forming a film stack (see, e.g., film stack 620 of FIG. 6) with an active film layer, for example, such as a scandium doped aluminum nitride layer in accordance with some embodiments. References to FIGS. 2-8 may be made during discussions of the method 100. A substrate 202 as depicted in a view 200 of FIG. 2 may be formed of, for example, silicon or silicon dioxide and the like which is not meant to be limiting. If the substrate 202 has been exposed to the environment, the substrate 202 may be degassed before beginning the film stack formation process. In block 102, a first seed layer 302 is deposited on the substrate 202 as depicted in a view 300 of FIG. 3. In some embodiments, a thickness 304 of the first seed layer 302 may be from approximately 10 nm to approximately 200 nm when a film stack with approximately 20% scandium doped aluminum nitride is formed. In some embodiments, a thickness 304 of the first seed layer 302 may be from approximately 10 nm to approximately 50 nm when a film stack with approximately 30% scandium doped aluminum nitride is formed. The first seed layer 302 may be comprised of aluminum nitride which may be deposited using a first deposition chamber such as, for example, a PVD deposition chamber using an aluminum nitride sputter target.

Figure 8:
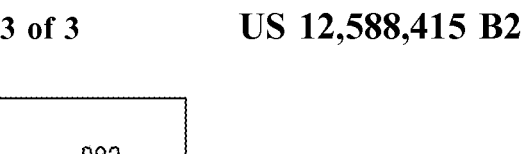
FIG. 8 depicts an integrated tool in accordance with some embodiments of the present principles.

In block 104, an intermediate film layer, for example, such as a molybdenum layer 408 is deposited on the first seed layer 304 as depicted in a view 400 of FIG. 4. The molybdenum layer 408 may function as an electrode when the film stack is used in some devices/systems. In some embodiments, a thickness 410 of the molybdenum layer 408 may be from approximately 20 nm to approximately 400 nm. The inventors have found that higher molybdenum thicknesses may facilitate in reducing surface cone defects on the scandium doped aluminum nitride layer. The molybdenum layer 408 may be deposited using a second deposition chamber such as, for example, a PVD deposition chamber using a molybdenum sputter target. In some embodiments, to optimize the reduction of surface cone defects on a scandium doped aluminum nitride layer, the molybdenum layer 408 may be deposited with no vacuum break between the deposition of the first seed layer 302 and the deposition of the molybdenum layer 408 to eliminate any possible contamination or particles on the first seed layer 302 before deposition of the molybdenum layer 408. For example, the first deposition chamber and the second deposition chamber may be part of an integrated tool 800 as depicted in FIG. 8 that operates in a vacuum environment where substrates may be transferred between chambers without a vacuum break.

The temperature of the molybdenum deposition process can be used to control surface cone defects on the scandium doped aluminum nitride layer. Higher molybdenum deposition temperatures produce a higher quality molybdenum film (e.g., lower FWHM), resulting in a reduction of surface cone defects on subsequently deposited scandium doped aluminum nitride layers. Higher quality molybdenum surfaces and crystal orientations produce higher quality scandium doped aluminum nitride surfaces (lower surface cone defects). For example, FWHMs of molybdenum films deposited at approximately 700° C. were reduced to less than approximately 1.2° from 2.5° from molybdenum films deposited at approximately 350° C. With the improvement of molybdenum film quality, the inventors have found that for both 20% and 30% scandium doped aluminum nitride layers, a deposition temperature of the molybdenum increasing to approximately 700 degrees Celsius can provide a surface cone defect count of less than or equal to 2 defects per 100 microns$^2$.

Figure 5:
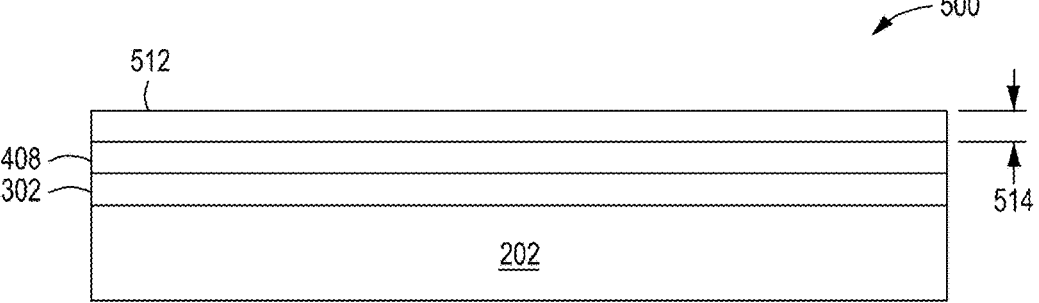
FIG. 5 depicts a cross-sectional view of forming a second seed layer on an intermediate film layer in accordance with some embodiments of the present principles.
Figure 6:
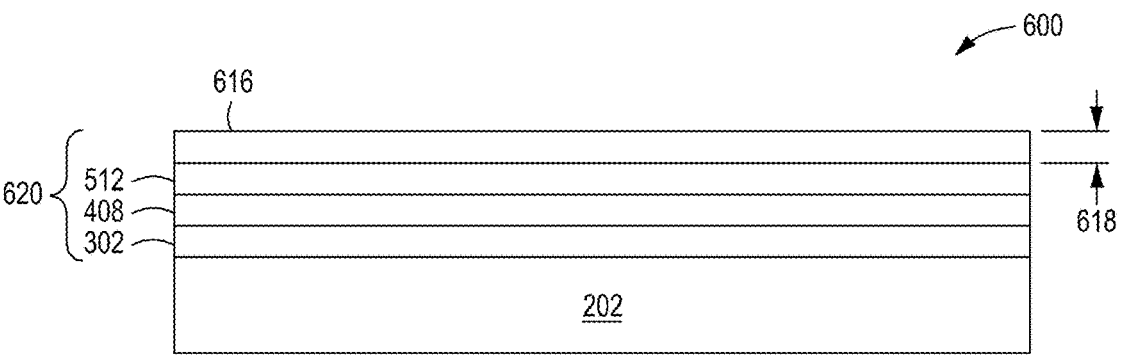
FIG. 6 depicts a cross-sectional view of forming an active film layer on a second seed layer in accordance with some embodiments of the present principles.

In block 106, a second seed layer 512 is deposited on the intermediate film layer such as the molybdenum layer 408 as depicted in a view 500 of FIG. 5. The addition of the second seed layer 512 enables a reduction of surface cone defects on subsequently deposited scandium doped aluminum nitride layers, even when lower molybdenum deposition temperatures are used (e.g., 350 degrees Celsius for 20% Sc (ScAlN) and 500 degrees Celsius for 30% Sc (ScAlN)). In some instances, lower process temperatures may be needed to meet thermal budget constraints for device fabrication. The methods of the present principles enable device manufacturers to now produce low thermal budget devices with low defect scandium doped aluminum nitride. In some embodiments, a thickness 514 of the second seed layer 512 may be from approximately 5 nm to approximately 55 nm when a film stack with approximately 20% scandium doped aluminum nitride is formed. In some embodiments, a thickness 514 of the second seed layer 512 may be from approximately 5 nm to approximately 40 nm when a film stack with approximately 30% scandium doped aluminum nitride is formed. The second seed layer 512 may be comprised of aluminum nitride which may be deposited using the first deposition chamber which may be, for example, a PVD deposition chamber using an aluminum nitride sputter target.

In some embodiments, to optimize the reduction of surface cone defects on an active film layer such as a scandium doped aluminum nitride layer, the second seed layer 512 may be deposited with no vacuum break between the deposition of molybdenum layer 408 and the deposition of the second seed layer 512 to eliminate any possible contamination or particles on the molybdenum layer 408 before deposition of the second seed layer 512. For example, the first deposition chamber and the second deposition chamber may be part of the integrated tool 800 as depicted in FIG. 8 that operates in a vacuum environment where substrates may be transferred between chambers without a vacuum break. The inventors believe that the immediate deposition of the second seed layer 512 retains the residual heat from the deposition of the molybdenum layer 408 in the second deposition chamber, and the residual heat may further facilitate in reducing surface cone defects of the scandium doped aluminum nitride layer. The second seed layer 512 functions as a transition layer between the molybdenum layer 408 and a scandium doped aluminum nitride layer 616 (described below) to facilitate in reducing surface cone defect counts for the scandium doped aluminum nitride layer 616 even when lower molybdenum deposition temperatures are used (e.g., equal to or less than 500 degrees Celsius).

In some embodiments, the substrate 202 may be cooled and exposed to an ambient environment. The substrate 202 would then be degassed before proceeding with the deposition of a scandium doped aluminum nitride layer. If the substrate 202 is cooled within the integrated tool 800, no degassing process is needed before proceeding with the depositing of the scandium doped aluminum nitride layer. In block 108, an active film layer such as, for example, a piezoelectric film layer comprising a scandium doped aluminum nitride layer 616 is deposited on the second seed layer 512 at a substrate temperature of less than 200 degrees Celsius (without pedestal heating) as depicted in a view 600 of FIG. 6. In some embodiments, the substrate temperature may be less than approximately 100 degrees Celsius. The low substrate temperature during deposition decreases surface defect formation. The inventors have found that the active film layer quality, especially with scandium doped aluminum nitride film, is determined during the nucleation stage. In some embodiments, the pedestal temperature can be set at approximately 25 degrees Celsius so as to not add any further heating to the substrate (which can be, for example, at a temperature of approximately 60 degrees Celsius to approximately 70 degrees Celsius after deposition of the second seed layer). Any heating of the substrate during PVD deposition of the active film layer is due to the deposition plasma.

In some embodiments, a thickness 618 of the scandium doped aluminum nitride layer 616 may be from approximately 5 nm to approximately 100 nm. The scandium doped aluminum nitride layer 616 is comprised of a scandium doped aluminum nitride which may be deposited using a third deposition chamber which may be, for example, a PVD deposition chamber using a composite sputter target of approximately 20% scandium doped aluminum nitride or approximately 30% scandium doped aluminum nitride. The third deposition chamber may be standalone or part of the integrated tool 800. The second seed layer 512 as discussed above provides a transition layer between the molybdenum layer 408 and the scandium doped aluminum nitride layer 616. Surface cone defects in the scandium doped aluminum nitride layer 616 may form during the nucleation stage of the deposition process. The inventors have found that deposition of scandium doped aluminum nitride on aluminum nitride (the second seed layer 512) causes fewer surface cone defects during the nucleation stage than deposition of scandium doped aluminum nitride on molybdenum during the nucleation stage.

The inventors have discovered that along with temperature, vacuum breaks, and time between depositions, the combination of the thicknesses of the first seed layer 302, the molybdenum layer 408, and the second seed layer 512 can also affect the surface cone defect count for scandium doped aluminum nitride layers. In some embodiments, to further reduce the surface cone defect count for approximately 20% scandium doped aluminum nitride, the first seed layer 304 has a thickness of approximately 150 nm, the molybdenum layer 408 has a thickness of approximately 200 nm, and the second seed layer 512 has a thickness of approximately 35 nm. In some embodiments, to further reduce the surface cone defect count for approximately 30% scandium doped aluminum nitride, the first seed layer 304 has a thickness of approximately 30 nm, the molybdenum layer 408 has a thickness of approximately 25 nm, and the second seed layer 512 has a thickness of approximately 10 nm.

The methods described herein may be performed in individual process chambers that may be provided in a standalone configuration or as part of a cluster tool, for example, the integrated tool 800 (i.e., cluster tool) described below with respect to FIG. 8. The advantage of using an integrated tool 800 is that there is no vacuum break between chambers and, therefore, no requirement to degas and pre-clean a substrate before treatment in a chamber. For example, in some embodiments the inventive methods discussed above may advantageously be performed in an integrated tool such that there are limited or no vacuum breaks between processes, limiting or preventing contamination of the substrate such as oxidation and the like. The integrated tool 800 includes a vacuum-tight processing platform 801, a factory interface 804, and a system controller 802. The processing platform 801 comprises multiple processing chambers, such as 814A, 813B, 814C, 814D, 814E, and 814F operatively coupled to a vacuum substrate transfer chamber (transfer chambers 803A, 803B). The factory interface 804 is operatively coupled to the transfer chamber 803A by one or more load lock chambers (two load lock chambers, such as 806A and 806B shown in FIG. 8).

In some embodiments, the factory interface 804 comprises at least one docking station 807, at least one factory interface robot 838 to facilitate the transfer of the semiconductor substrates. The docking station 807 is configured to accept one or more front opening unified pod (FOUP). Four FOUPS, such as 805A, 805B, 805C, and 805D are shown in the embodiment of FIG. 8. The factory interface robot 838 is configured to transfer the substrates from the factory interface 804 to the processing platform 801 through the load lock chambers, such as 806A and 806B. Each of the load lock chambers 806A and 806B have a first port coupled to the factory interface 804 and a second port coupled to the transfer chamber 803A. The load lock chamber 806A and 806B are coupled to a pressure control system (not shown)

which pumps down and vents the load lock chambers 806A and 806B to facilitate passing the substrates between the vacuum environment of the transfer chamber 803A and the substantially ambient (e.g., atmospheric) environment of the factory interface 804. The transfer chambers 803A, 803B have vacuum robots 842A, 842B disposed in the respective transfer chambers 803A, 803B. The vacuum robot 842A is capable of transferring substrates 821 between the load lock chamber 806A, 806B, the processing chambers 814A and 814F and a cooldown station 840 or a pre-clean station 842. The vacuum robot 842B is capable of transferring substrates 821 between the cooldown station 840 or pre-clean station 842 and the processing chambers 814B, 814C, 814D, and 814E.

In some embodiments, the processing chambers 814A, 814B, 814C, 814D, 814E, and 814F are coupled to the transfer chambers 803A, 803B. The processing chambers 814A, 814B, 814C, 814D, 814E, and 814F may comprise, for example, an atomic layer deposition (ALD) process chamber, a physical vapor deposition (PVD) process chamber, chemical vapor deposition (CVD) chambers, annealing chambers, or the like. The chambers may include any chambers suitable to perform all or portions of the methods described herein, as discussed above, such as a molybdenum deposition chambers, aluminum nitride deposition chamber, a scandium doped aluminum nitride deposition chamber, and the like. In some embodiments, one or more optional service chambers (shown as 816A and 816B) may be coupled to the transfer chamber 803A. The service chambers 816A and 816B may be configured to perform other substrate processes, such as degassing, orientation, substrate metrology, cool down, and the like.

The system controller 802 controls the operation of the tool 800 using a direct control of the process chambers 814A, 814B, 814C, 814D, 814E, and 814F or alternatively, by controlling the computers (or controllers) associated with the process chambers 814A, 814B, 814C, 814D, 814E, and 814F and the tool 800. In operation, the system controller 802 enables data collection and feedback from the respective chambers and systems to optimize performance of the tool 800. The system controller 802 generally includes a Central Processing Unit (CPU) 830, a memory 834, and a support circuit 832. The CPU 830 may be any form of a general-purpose computer processor that can be used in an industrial setting. The support circuit 832 is conventionally coupled to the CPU 830 and may comprise a cache, clock circuits, input/output subsystems, power supplies, and the like. Software routines, such as a method as described above may be stored in the memory 834 and, when executed by the CPU 830, transform the CPU 830 into a specific purpose computer (system controller) 802. The software routines may also be stored and/or executed by a second controller (not shown) that is located remotely from the tool 800.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of reducing surface defects of a film layer, comprising:

degassing a substrate;

depositing a first seed layer on the substrate in a vacuum after degassing;

depositing an intermediate film layer on the first seed layer at a first temperature of 350 degrees Celsius to 700 degrees Celsius without a vacuum break between depositing the first seed layer and depositing the intermediate film layer;

depositing a second seed layer on the intermediate film layer without a vacuum break between depositing the intermediate film layer and depositing the second seed layer;

cooling the substrate by exposing the substrate to an ambient environment;

degassing the substrate; and depositing a piezoelectric film layer on the second seed layer at a second temperature of less than 200 degrees Celsius.

2. The method of claim 1, wherein the first seed layer is deposited in a first deposition chamber, the intermediate film layer is deposited in a second deposition chamber, and piezoelectric film layer is deposited in a third deposition chamber.

3. The method of claim 1, wherein the intermediate film layer is a molybdenum layer and the piezoelectric film layer is a scandium doped aluminum nitride layer.

4. The method of claim 3, wherein the scandium doped aluminum nitride layer has a surface cone defect count of less than or equal to 2 per 100 microns$^2$ of surface area of the scandium doped aluminum nitride layer due, at least in part, to increased crystallinity of the intermediate film layer during deposition and to deposition of the second seed layer prior to deposition of the piezoelectric film layer.

5. The method of claim 3, wherein the first seed layer is aluminum nitride and the second seed layer is aluminum nitride.

6. The method of claim 3, wherein the scandium doped aluminum nitride layer is 20% scandium.

7. The method of claim 6, wherein the first seed layer is 10 nm to 200 nm in thickness.

8. The method of claim 6, wherein the second seed layer is 5 nm to 55 nm in thickness.

9. The method of claim 6, wherein the first seed layer has a thickness of 150 nm, the molybdenum layer has a thickness of from 20 nm to 400 nm, and the second seed layer has a thickness of 35 nm.

10. The method of claim 3, wherein the scandium doped aluminum nitride layer is 30% scandium.

11. The method of claim 10, wherein the first seed layer is 10 nm to 50 nm in thickness.

12. The method of claim 10, wherein the second seed layer is 5 nm to 40 nm in thickness.

13. The method of claim 10, wherein the first seed layer has a thickness of 30 nm, the molybdenum layer has a thickness of 25 nm, and the second seed layer has a thickness of 10 nm.

14. A method of reducing surface defects of a film layer, comprising:

degassing a substrate;

depositing a first seed layer of aluminum nitride on the substrate in a vacuum in a first deposition chamber after degassing;

moving the substrate from the first deposition chamber to a second deposition chamber without a vacuum break;

depositing a molybdenum layer on the first seed layer in the second deposition chamber at a first temperature of 350 degrees Celsius to approximately 700 degrees Celsius;

moving the substrate from the second deposition chamber to the first deposition chamber without a vacuum break;

depositing a second seed layer of aluminum nitride on the molybdenum layer after depositing the molybdenum layer;

cooling the substrate and exposing the substrate to ambient environment;

degassing the substrate; and depositing a scandium doped aluminum nitride layer at a second temperature of less than 200 degrees Celsius in a third deposition chamber, wherein the scandium doped aluminum nitride layer has a surface cone defect count of less than or equal to 2 per 100 microns$^2$ of surface area of the scandium doped aluminum nitride layer.

15. The method of claim 14, wherein the scandium doped aluminum nitride layer is approximately 20% scandium.

16. The method of claim 15, wherein the first seed layer is approximately 10 nm to approximately 200 nm in thickness and wherein the second seed layer is approximately 5 nm to approximately 55 nm in thickness.

17. The method of claim 14, wherein the scandium doped aluminum nitride layer is approximately 30% scandium.

18. The method of claim 17, wherein the first seed layer is approximately 10 nm to approximately 50 nm in thickness and wherein the second seed layer is approximately 5 nm to approximately 40 nm in thickness.

19. A non-transitory, computer readable medium having instructions stored thereon that, when executed, cause a method of reducing surface defects of a film layer to be performed, the method comprising:

degassing a substrate;

depositing a first seed layer on a substrate in a vacuum after degassing;

depositing a molybdenum layer on the first seed layer at a first temperature of 350 degrees Celsius to 700 degrees Celsius without a vacuum break between depositing the first seed layer and depositing the molybdenum layer;

depositing a second seed layer on the molybdenum layer without a vacuum break between depositing the molybdenum layer and depositing the second seed layer;

cooling the substrate by exposing the substrate to an ambient environment;

degassing the substrate; and depositing a scandium doped aluminum nitride layer at a second temperature of less than 200 degrees Celsius, wherein the scandium doped aluminum nitride layer has a surface cone defect count of less than or equal to 2 per 100 microns$^2$ of surface area of the scandium doped aluminum nitride layer.

20. The non-transitory, computer readable medium of claim 19, wherein the scandium doped aluminum nitride layer is 20% or 30% scandium, wherein the first seed layer has a thickness of 10 nm to 200 nm for 20% scandium, wherein first seed layer has a thickness of 10 nm to 50 nm for 30% scandium, wherein the molybdenum layer has a thickness of 20 nm to 250 nm for 20% scandium or 30% scandium, wherein the second seed layer has a thickness of 5 nm to 55 nm for 20% scandium, and wherein the second seed layer has a thickness of 5 nm to 40 nm for 30% scandium.

* * * * *